US010574186B1

(12) United States Patent
Emira et al.

(10) Patent No.: US 10,574,186 B1
(45) Date of Patent: Feb. 25, 2020

(54) VOLTAGE CONTROLLED OSCILLATOR PULLING REDUCTION (71) Applicant: SHENZHEN GOODIX TECHNOLOGY CO., LTD., Shenzhen (CN)

(72) Inventors: Ahmed Emira, San Diego, CA (US); Faisal Hussein, San Diego, CA (US)

(73) Assignee: SHENZHEN GOODIX TECHNOLOGYCO., LTD., Shenzhen (CN)

(*) Notice: Subject to any disclaimer, the term of this patent is extended or adjusted under 35 U.S.C. 154(b) by 0 days.

(21) Appl. No.: 16/214,038

(22) Filed: Dec. 8, 2018

(51) Int. Cl.
H03K 5/133 (2014.01)
H03B 21/01 (2006.01)
H03B 5/12 (2006.01)
H03L 7/099 (2006.01)
H03L 7/089 (2006.01)

(52) U.S. Cl.
CPC ........... H03B 21/01 (2013.01); H03B 5/1209 (2013.01); H03B 5/1228 (2013.01); H03L 7/089 (2013.01); H03L 7/099 (2013.01)

(58) Field of Classification Search
CPC ......... H03K 5/133; H03L 7/089; H03L 7/099; H03B 5/1209; H03B 5/1228
USPC ......... 327/233, 250–253, 261, 262, 276–290
See application file for complete search history.

(56) References Cited

U.S. PATENT DOCUMENTS 3,639,838 A * 2/1972 Kuhn ................... H04B 7/2126
375/356
3,750,179 A * 7/1973 Tewksbury .......... H04B 14/026
375/219
5,847,621 A * 12/1998 Gutierrez ............. H03B 5/1231
331/117 R
6,242,959 B1 * 6/2001 Stern ...................... H03K 5/131
327/262
8,306,484 B1 * 11/2012 Horng ................. H04B 1/0475
455/102

(Continued)

FOREIGN PATENT DOCUMENTS

CN 102801415 A 11/2012
CN 105871389 A 8/2016

(Continued)

OTHER PUBLICATIONS

International Search Report dated Oct. 9, 2019 in the corresponding International application (application No. PCT/CN2019/094607).

Primary Examiner — Tomi Skibinski
(74) Attorney, Agent, or Firm — Kilpatrick Townsend & Stockton LLP (57) ABSTRACT Techniques are described for reducing frequency pulling in voltage-controlled oscillator (VCO) circuits. Some embodiments operate in context of a transmitter having a VCO and a power amplifier (PA), where resonant components of the VCO are impacted by magnetically coupled feedback from resonant components of the PA. The VCO and PA are coupled via a set of signal path components that cause signal path delay, such that the feedback signal is phase-delayed with respect to the signal generated by the VCO. A coupling delay matching system is used to introduce additional delay, thereby further phase-shifting the feedback signal to an integer multiple of half of the oscillation period of the VCO signal; thereby reducing frequency pulling of the VCO.

20 Claims, 5 Drawing Sheets (56) References Cited

U.S. PATENT DOCUMENTS

| | | | |
|---|---|---|---|
| 2004/0247041 A1* | 12/2004 | Biedka | H03C 5/00 375/295 |
| 2008/0278249 A1* | 11/2008 | Hyvonen | H03B 5/1228 331/117 R |
| 2010/0171535 A1 | 7/2010 | Shanan | |
| 2014/0191811 A1 | 7/2014 | Mirzaei et al. | |
| 2015/0229317 A1* | 8/2015 | Juneau | H03L 7/18 327/105 |

FOREIGN PATENT DOCUMENTS

| | | |
|---|---|---|
| CN | 107332523 A | 11/2017 |
| CN | 108063624 A | 5/2018 |

* cited by examiner

VOLTAGE CONTROLLED OSCILLATOR PULLING REDUCTION

FIELD OF THE INVENTION

The present invention relates generally to transmitter circuits. More particularly, embodiments of the present invention relate to reducing pulling of a voltage-controlled oscillator frequency by magnetic coupling with inductive components of a power amplifier in a transmitter circuit.

BACKGROUND OF THE INVENTION

Various types of electronic applications can include transmitters, or the like, which can include voltage-controlled oscillators (VCOs) and power amplifiers. In such circuits, a VCO can be in the generation and/or modulation of a signal for transmission (e.g., as part of a clock circuit, such as a phase-locked loop), and the power amplifier can be used to apply gain to the signal prior to transmission (e.g., and/or for setting output impedance, etc.). Both the VCO and the power amplifier typically include one or more inductors, for example, as part of respective inductive-capacitive (LC) oscillator networks. Relatively high currents passing through the inductor(s) of the power amplifier can tend to magnetically couple back to the inductor(s) of the VCO, which can tend to pull (e.g., detune) the frequency of the VCO.

Conventionally, multiple categories of approaches are used to mitigate this pulling. One category seeks to ensure that the frequency of the VCO is as close to identical as practical to the frequency of the power amplifier. Conceptually, when the frequencies are the same, any magnetic coupling from the power amplifier should tend not to pull on the frequency of the VCO (e.g., the magnetic coupling may, instead, reinforce oscillation of the VCO at the shared frequency). A second category seeks to maintain a large separation between the frequency of the VCO and the frequency of the power amplifier (e.g., so that the power amplifier frequency is well outside the operating frequency band of the VCO). For example, an additional modulator circuit can be used, so that the signal output by the VCO is modulated to a very different frequency prior to being received by the power amplifier. Conceptually, sufficiently separating the frequencies should effectively avoid any magnetic coupling.

BRIEF SUMMARY OF THE INVENTION

Embodiments provide circuits, devices, and methods for reducing frequency pulling in voltage-controlled oscillator (VCO) circuits. Some embodiments operate in context of a transmitter having a VCO and a power amplifier (PA), where resonant components of the VCO are impacted by magnetically coupled feedback from resonant components of the PA. The VCO and PA are electrically coupled via a set of signal path components that cause signal path delay, such that the feedback signal is phase-delayed with respect to the signal generated by the VCO. A coupling delay matching (CDM) system is used to introduce additional delay, thereby further phase-shifting the feedback signal to an integer multiple of the oscillation period of the VCO signal (or half of the oscillation period, resulting in either a zero-degree, or 180-degree respective phase delay); thereby reducing frequency pulling of the VCO. Though descriptions herein refer generally to non-zero phase delays between the feedback signal and the signal generated by the VCO, it will be appreciated that some implementations can reduce frequency pulling by phase-adjusting the feedback signal and the signal generated by the VCO either to be completely in-phase (e.g., having a zero-degree phase difference) or to be completely out-of-phase (e.g., having a 180-degree phase difference). As such, terms, such as "asynchrony," or the like, are used herein to refer to phase delays that contribute to frequency pulling, which typically includes respective phase differences of other than zero or 180 degrees.

According to one set of embodiments, a transmitter system is provided. The system includes a voltage-controlled oscillator (VCO), a power amplifier (PA), and a signal path having a set of signal path components and a (CDM) subsystem. The VCO has a first inductor coupled with a VCO output, such that a VCO signal generated at the VCO output oscillates at a VCO period in accordance with oscillation of the first inductor. The PA has a second inductor coupled with a PA input, such that the second inductor oscillates at a PA period in accordance with oscillation of a PA signal received at the PA input. The signal path is coupled between the VCO output and the PA input, such that the PA period is substantially the VCO period. The set of signal path components introduces a first signal delay between the VCO output and the PA input. The CDM subsystem generates a second signal delay between the VCO output and the PA input, the second signal delay determined such that introducing the first signal delay and the second signal delay into the signal path causes the PA signal to be phase-shifted with respect to the VCO signal by an amount corresponding to an integer multiple of the VCO period.

According to another set of embodiments, a method is provided for coupling delay matching. The method includes: receiving a signal by a programmable delay component, the signal oscillating at a VCO period, the signal received from a voltage-controlled oscillator (VCO) via a set of signal path components, such that the signal as received by the programmable delay component is delayed with respect to the signal as output by the VCO by a first signal delay introduced by the set of signal path components; delaying the signal, subsequent to the receiving, by a second signal delay using the programmable delay component; and outputting the signal, subsequent to the delaying, from the programmable delay component to a power amplifier (PA), the second signal delay determined such that the signal as received by the PA is delayed by at least the first signal delay and the second signal delay with respect to the signal as output by the VCO so as to be phase-shifted by an amount corresponding to an integer multiple of the VCO period.

According to another set of embodiments, a coupling delay matching (CDM) system is provided. The system includes an input node, and output node, and a programmable delay component. The input node is to couple with an output of a voltage-controlled oscillator (VCO) via a set of signal path components, such that a signal as received at the input node is delayed by a first signal delay with respect to the signal as output by the VCO, the first signal delay introduced by the set of signal path components, the signal oscillating at a VCO period. The output node is to couple with an input of a power amplifier (PA). The programmable delay component is coupled between the input node and the output node, such that the signal as output at the output node is delayed by a second signal delay with respect to the signal as received at the input node, the second signal delay introduced by the programmable delay component, the second signal delay determined such that introducing the first signal delay and the second signal delay causes the PA signal to be phase-shifted with respect to the VCO signal by an amount corresponding to an integer multiple of the VCO period.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
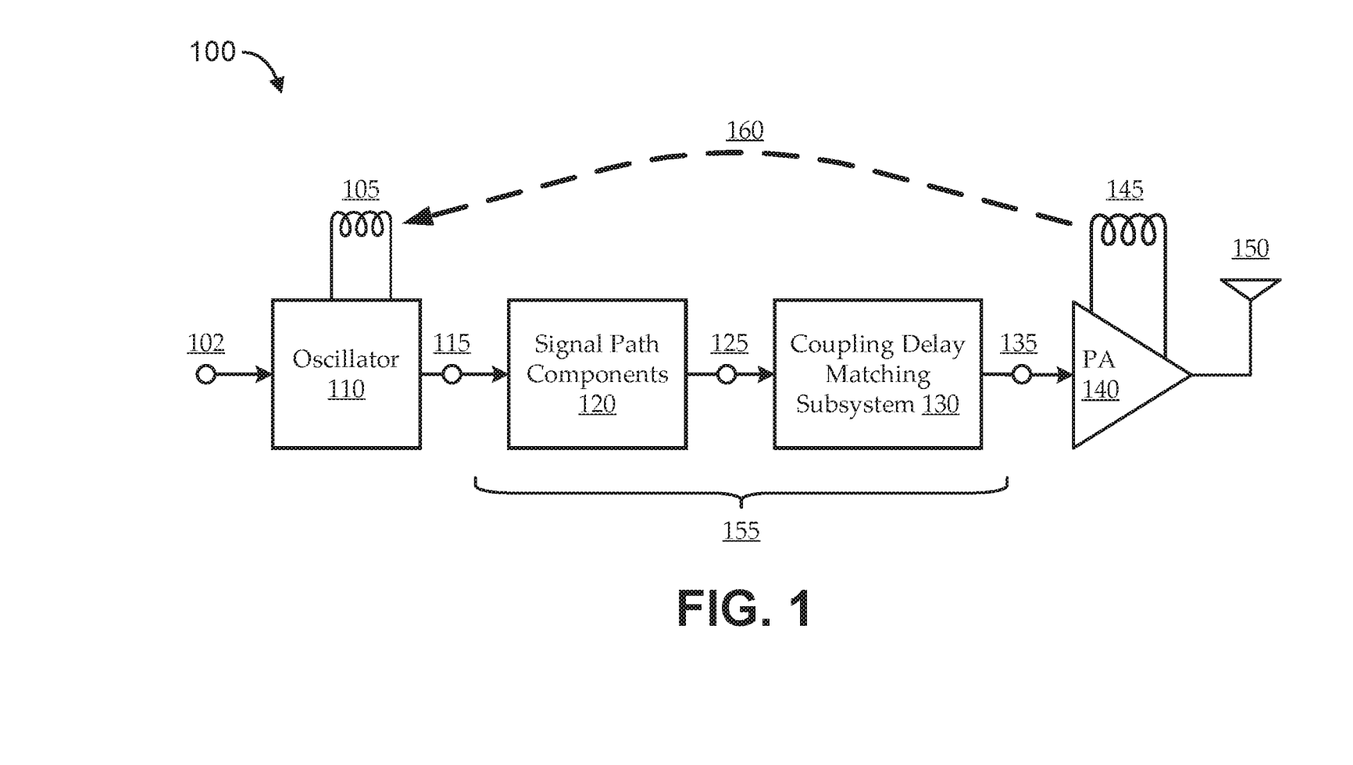
FIG. 1 shows an illustrative transmitter system, as context for various embodiments.

FIG. 1 shows an illustrative transmitter system 100, as context for various embodiments. The transmitter system 100 includes a voltage-controlled oscillator (VCO) 110, a power amplifier (PA) 140, and a signal path 155 coupled between the VCO 110 and the PA 140. For example, the VCO 110 can receive a data signal 102 and can modulate the data signal 102 to generate a modulated signal 115 at the output of the VCO 110. The modulated signal 115 can then pass through the signal path 155, such that it is received as a PA signal 135 by the PA 140. The PA 140 can then transmit the PA signal 135 using an antenna 150, or the like.

As illustrated, the VCO 110 includes a first inductor 105, and the PA 140 includes a second inductor 145. For example, in the VCO 110, the first inductor 105 can be part of a first inductive-capacitive (LC) oscillator circuit that oscillates at a particular oscillation frequency corresponding to the inductive and capacitive values of the LC circuit. In the VCO 110 context, the oscillation frequency can be further controlled by a control voltage. For example, the control voltage can be set to a particular level corresponding to a particular oscillation frequency, the control voltage can be dynamically controlled by a feedback network (e.g., as part of a phase-locked loop, or the like) to maintain a desired oscillation frequency, the control voltage can be varied for certain applications, etc. Though embodiments are described with particular reference to a VCO 110, techniques described herein can be used in context of any suitable inductive oscillator (i.e., whether or not the oscillator is voltage controlled).

In the PA 140, the second inductor 145 can be part of a second LC oscillator circuit. In some implementations, the oscillation frequency of the second LC oscillator circuit corresponds to the frequency of the PA signal 135 received by the PA 140. For example, the received PA signal 135 is amplified (i.e., the PA 140 applies gain to the PA signal 135), and is used to drive oscillation in the second LC oscillator circuit, facilitating transmission via the antenna 150. Typically, a relatively high current flows through the second inductor 145 (e.g., resulting from the gain applied to the PA signal 135 by the PA 140).

The high inductor current in the second inductor 145 can cause magnetic coupling with the first inductor 105, as indicated by arrow 160. The magnetic coupling can induce current flow in the first inductor 105, which can effectively pull the frequency of the first inductor 105. This pulling is referred to herein as "VCO pulling," and is intended generally to include pulling or pushing of the oscillation frequency.

Figure 2:
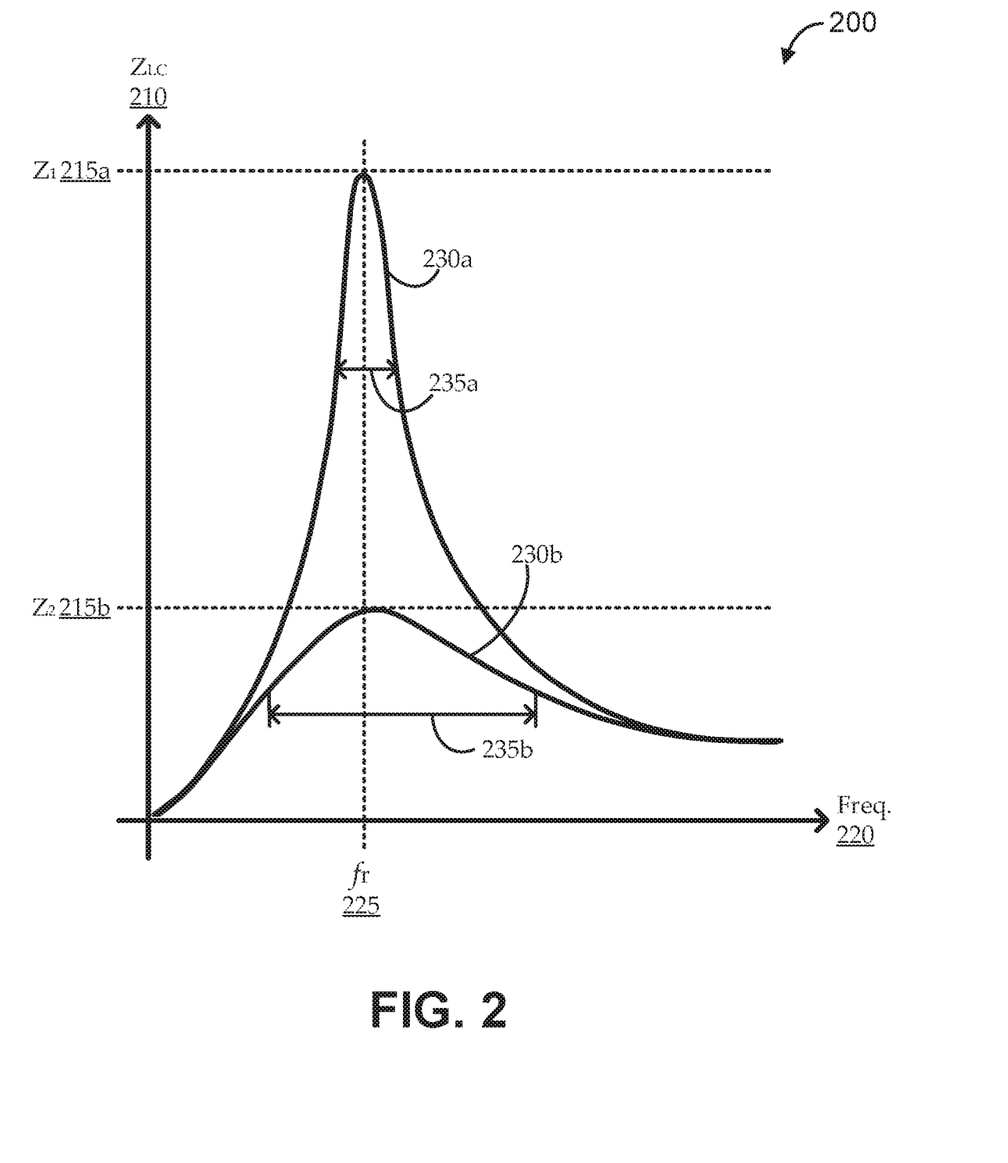
FIG. 2 shows a plot representing quality factors for illustrative oscillators.

For example, FIG. 2 shows a plot 200 representing quality factors for illustrative oscillators, such as the VCO 110. The quality factor, or "Q factor," of an oscillator generally represents the oscillator's bandwidth with respect to its center (e.g., resonant) frequency. An oscillator with a high Q factor tends to have a lower bandwidth around its center frequency, such that it is less susceptible to oscillator pulling. The plot 200 shows impedance 210 as a function of frequency 220 for two illustrative oscillators. For the sake of illustration, respective bandwidths 235 can be measured at impedance levels corresponding to a fifty percent confidence level of a continuous distribution (e.g., 0.707 times corresponding maximum impedance 215 levels).

A first oscillator, characterized by line 230a, has a relatively high Q factor. Accordingly, the first oscillator manifests a relatively high maximum impedance 215a, and a relatively low bandwidth 235a around its center frequency 225. In the illustrated plot, the bandwidth is measured at an impedance level A second oscillator, characterized by line 230b, has a relatively low Q factor. Accordingly, the second oscillator manifests a relatively low maximum impedance 215b, and a relatively high bandwidth 235b around its center frequency 225 (the two oscillators are shown with the same center frequency 225). In such a context, the second oscillator is likely more susceptible to VCO pulling.

Certain conventional approaches are typically used to mitigate VCO pulling. One conventional approach is to distance the PA and the VCO sufficiently far apart as to minimize the magnetic coupling effects of the PA on the VCO. However, many applications cannot support the amount of distance needed between the components for such an approach, and such an approach is impractical in those applications. Another conventional approach seeks to maintain a large separation between the oscillation frequency of the VCO and the oscillation frequency of the PA. For example, some transmitters include an additional modulator circuit that re-modulates to the signal output from the VCO to another frequency, so that the signal received by the PA at a frequency far outside the operating frequency band of the VCO. By sufficiently separating the frequencies, any magnetic coupling will not impact oscillation of the inductor of the VCO. However, such an approach may not be desirable or practical, for example, where it is undesirable to include an additional modulator circuit (e.g., which may also involve additional clocks, etc.) and/or where it is undesirable to use different frequencies. Further, even when using different frequencies, there can be overlap between harmonics of those frequencies, such that VCO pulling can still be present from magnetic coupling at those harmonic frequencies. Another conventional approach is seeks to ensure that the oscillation frequency of the VCO is the same as that of the PA. Such an approach is founded on a conventionally held assumption that, when the frequencies are the same, any magnetic coupling from the PA should not cause any VCO pulling; rather, the magnetic coupling may reinforce oscillation of the VCO at the shared frequency.

Returning to FIG. 1, as illustrated, the signal path 155 includes a set of (i.e., one or more) signal path components 120, such as buffers, filters, etc. During operation of the transmitter system 100, each signal path component 120 can potentially introduce delay into the signal path 155. As described above, it is conventionally assumed that VCO pulling can be avoided by ensuring that the oscillation frequency of the VCO 110 is the same as that of the PA 140. Contrary to this conventionally held assumption, even where the VCO 110 oscillation frequency is the same as the PA 140 oscillation frequency (e.g., or close enough to be considered the same), VCO pulling can still result from phase differences caused by the delays in the signal path 155.

Even if the signal frequency remains unchanged over the signal path 155, delays introduced into the signal path 155 can manifest as a phase shift between the modulated signal 115 (also referred to as the VCO signal 115) produced by the VCO 110, and the instance of that signal that is effectively fed back to the VCO 110 from the PA 140 by magnetic coupling from the second inductor 145. Accordingly, a phase asynchrony can be present between oscillating currents in the first inductor 105 generated by the VCO 110 circuitry, and oscillating currents in the first inductor 105 induced by the magnetic coupling. The asynchrony can manifest as VCO pulling.

As illustrated, embodiments include a coupling delay matching (CDM) subsystem 130. Embodiments of the CDM subsystem 130 generate an additional signal delay (in addition to the delay introduced by the set of signal path components 120) into the signal path 155. As described herein, the amount of additional signal delay is determined, so that introducing the first signal delay and the second signal delay into the signal path 155 together causes the signal received by the PA 140 (referred to as PA signal 135) to be phase-shifted with respect to the VCO signal by an amount corresponding to an integer multiple of the VCO period. Accordingly, the instance of that signal fed back via magnetic coupling (indicated by arrow 160) is similarly phase-shifted. Due to the additional delay, oscillating currents in the first inductor 105 generated by the VCO 110 circuitry and oscillating currents in the first inductor 105 induced by the magnetic coupling are effectively offset by an integer number of periods (and the currents oscillate at substantially the same period); such that the currents constructively reinforce in the first inductor 105 with reduced (or no) VCO pulling.

Figure 3A:
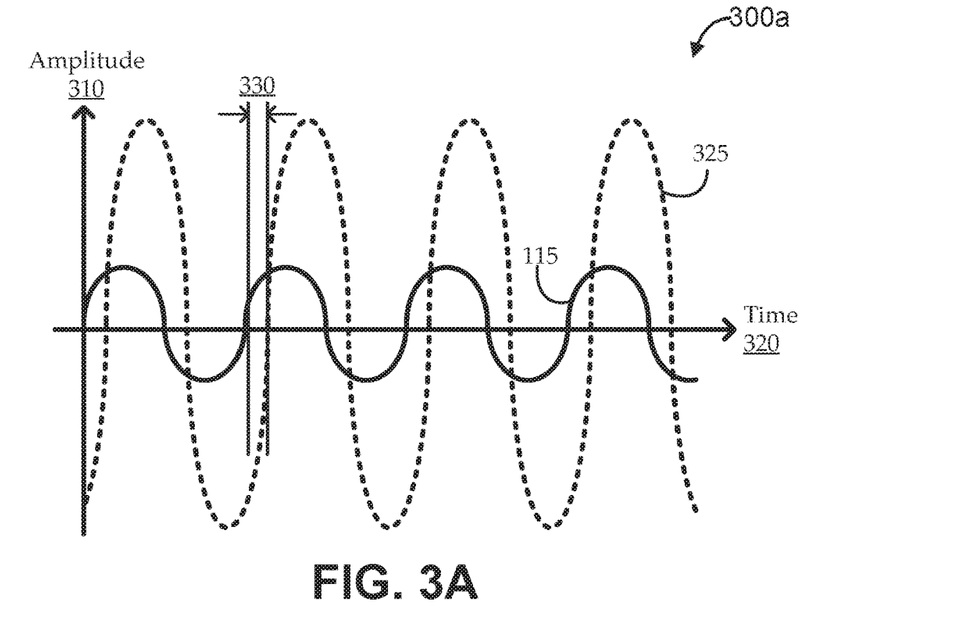
FIGS. 3A and 3B show plots representing signal path delays without and with an additional delay introduced by a coupling delay matching (CDM) subsystem, respectively.
Figure 3B:
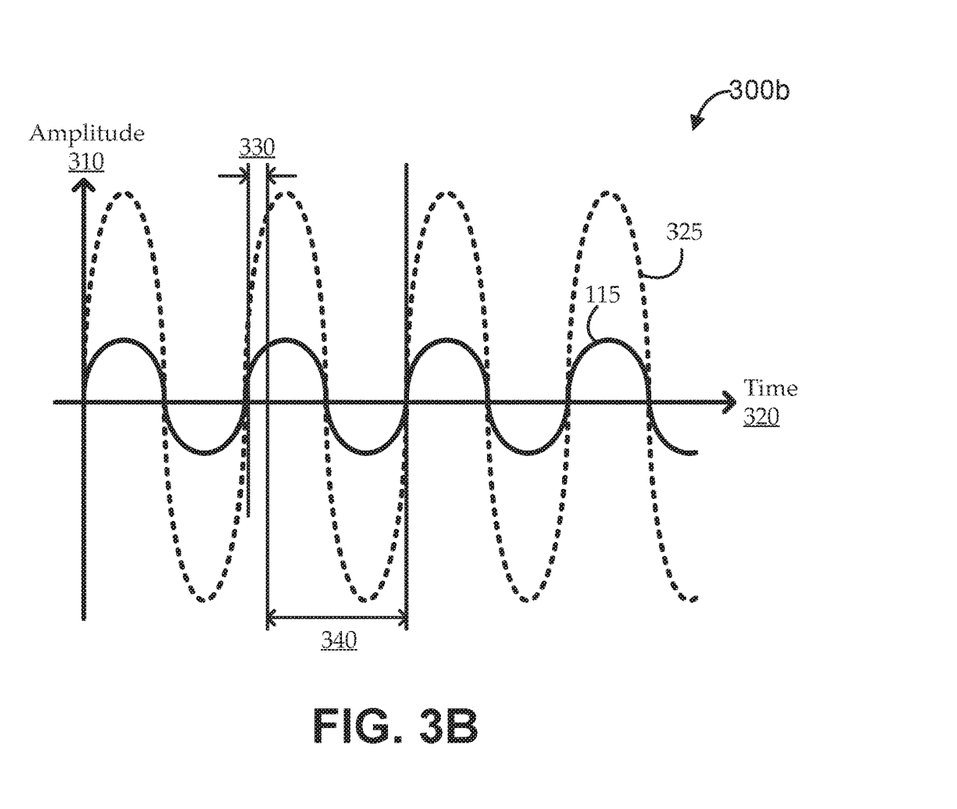

For example, FIGS. 3A and 3B show plots 300 representing signal path delays without and with an additional delay introduced by a CDM subsystem 130, respectively. Each plot 300 shows amplitude 310 over time 320 for an illustrative instance of the VCO signal 115 and the fed-back signal 325 (i.e., the signal magnetically coupled from the second inductor 145 back to the first inductor 105). As illustrated, the VCO signal 115 and the fed-back signal 325 can have the same frequency (or approximately the same frequency), and the fed-back signal 325 can have a different (e.g., typically larger) amplitude than the VCO signal 115 due to the gain applied by the PA 140.

Turning first to FIG. 3A, the plot 300a shows only the first delay 330 described above, which results from the set of signal path components 120. As illustrated, the first delay 330 typically corresponds to a fractional portion of the oscillation period of the VCO signal 115 (and of the fed-back signal 325). As described above, the CDM subsystem 130 is used to introduce additional delay. Turning to FIG. 3B, the plot 300b shows both the first delay 330 and an additional second delay 340 introduced by an illustrative CDM subsystem 130. As illustrated, the CDM subsystem 130 can be configured, so that the first delay and the second delay 340 together correspond approximately to a period or half-period (or N half-periods, where N is an integer) of the VCO signal 115 (and of the fed-back signal 325).

Figure 4:
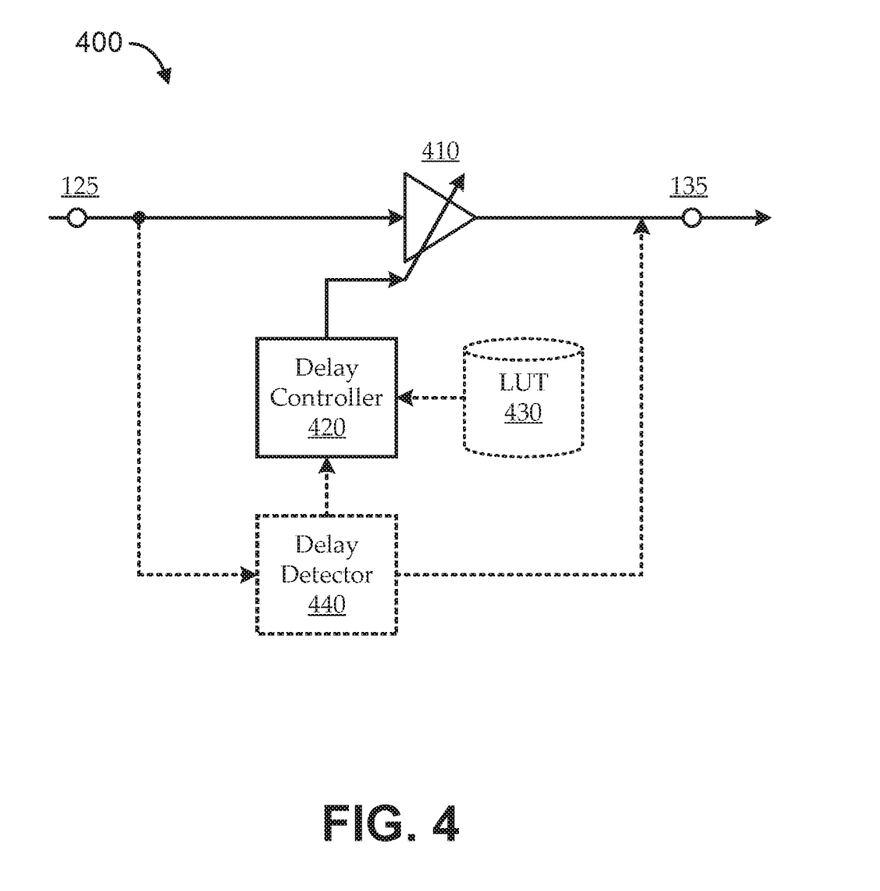
FIG. 4 shows a block diagram of an illustrative automated CDM system, according to various embodiments.

FIG. 4 shows a block diagram of an illustrative automated coupling delay matching (CDM) system 400, according to various embodiments. The CDM system 400 can be an implementation of the CDM subsystem 130 of FIG. 1. For the sake of context, the CDM system 400 is illustrated as being situated between nodes 125 and 135 of the signal path 155 of FIG. 1; thereby receiving a signal (at node 125) as output by the set of signal path components 120, and outputting the signal (PA signal 135) to the PA 140. Though illustrated as such, this is not intended to limit the location or operation of embodiments, and embodiments can alternatively be implemented in other configurations with similar effect. For example, the CDM system 400 can be coupled between nodes 115 and 125 of FIG. 1. In such a configuration, the CDM system 400 can receive the VCO signal 115, introduce the second signal delay, and pass the already delayed signal at node 125 to the set of signal path components 120 (i.e., the set of signal path components 120 can then introduce the first signal delay prior to passing the signal with both the first and second delays to the PA 140).

As illustrated, the CDM system 400 includes a variable delay component 410 and a delay controller 420. The variable delay component 410 is configured to introduce the second signal delay described above. In some implementations, the variable delay component 410 is a programmable-delay amplifier (e.g., radiofrequency amplifier) programmed via the delay controller 420 to generate the second signal delay. For example, during simulation (e.g., of the transmitter system 100 of FIG. 1), bench testing, operation, or at any other suitable time, an appropriate second signal delay can be determined. The determined delay can be programmed (e.g., hard-coded, soft-coded, etc.) into the delay controller 420, which configures the variable delay component 410 to introduce the second signal delay into the signal path 155. In some implementations, the variable delay component 410 and the delay controller 420 are integrated into a single component. For example, the delay controller 420 can be implemented as a set of adjustable circuit components coupled with, and thereby setting delay parameters of, the variable delay component 410.

In some instances, changes in process, temperature, and/or other factors can frustrate attempts to statically program the variable delay component 410. In other instances, the oscillating frequency of the VCO 110 and/or other parameters of the transmitter environment can be adjusted, such that a single, statically programmed delay setting may not be usable for a particular application. For example, in context of variable-frequency oscillators, tunable transmitters, and the like, the oscillation frequency of the VCO 110 is likely to change over time; which may impact the amount of phase-shifting between the VCO signal 115 and the magnetically coupled feedback signal.

Accordingly, various embodiments include components that support non-static programming of the variable delay component 410. In some such embodiments, the delay controller 420 is configured to receive commands by which to change the amount of delay introduced by the variable delay component 410. For example, the delay controller 420, and/or the variable delay component 410, can include one or more variable current sources, one or more variable capacitors, etc.; and adjusting one or more currents and/or capacitances can yield an adjustment in the second signal delay. The commands can be received in any suitable manner, such as via one or more digital or analog signals or level changes.

In other such embodiments, the CDM system 400 includes a lookup table (LUT) 430. The LUT 430 can have, stored thereon, multiple selectable delay settings. For example, during simulation, testing, or at any other suitable time, multiple delay setting options can be determined for multiple conditions (e.g., multiple process, voltage, temperature, or other such conditions; multiple frequency settings, or other such conditions; etc.). Some or all of those setting options can be stored to the LUT 430. Upon detection of certain conditions (e.g., automatic detection of particular conditions, receipt of signaling from one or more manual or automated systems, etc.), the delay controller 420 can select an appropriate one of the settings options stored in the LUT 430, and the selected one of the settings options can be used to configure the variable delay component 410 to introduce a desired second signal delay corresponding to the detected conditions.

In other such embodiments, the CDM system 400 further includes a delay detector 440. Embodiments of the delay detector 440 detect a phase delay (e.g., directly or indirectly) between the PA signal 135 and the VCO signal 115 (or between the VCO signal 115 and the magnetically coupled, fed-back signal). The phase delay detected by the delay detector 440 can be used by the delay controller 420 to dynamically configure the variable delay component 410 to introduce an amount of second signal delay corresponding to the detected phase delay. In some embodiments, the delay detector 440 is part of a dynamic feedback system, such that changes in conditions are dynamically detected by the delay detector 440, and the second signal delay is dynamically adjusted in response to the detected changes in condition.

In some such implementations, the delay detector 440 can inject a test signal (e.g., a beacon signal, a signal with known data or other properties, etc.) into the signal path 155, subsequently receive the test signal (e.g., by parsing the injected signal from other signals traversing the signal path 155), and can detect the phase delay as between the injected instance of the test signal and the received instance of the test signal. Such a technique can be combined with other techniques. For example, the test signal approach can be used by the delay detector 440 to dynamically or periodically check for changes in operating conditions (e.g., or as part of a boot-up routine, test routine, across temperature variations, or the like), and the detected changes can drive selection by the delay controller 420 of stored options in the LUT 430.

Figure 5:
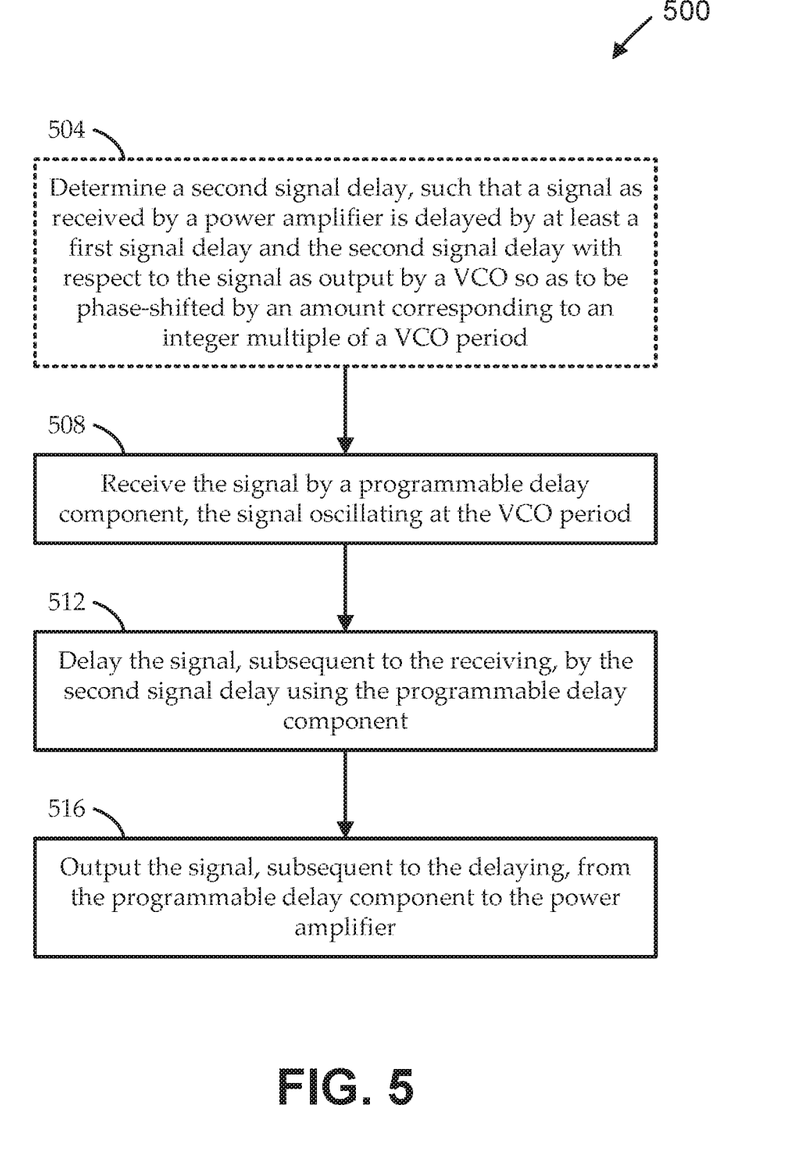
FIG. 5 shows a flow diagram of an illustrative method for coupling delay matching, according to various embodiments.

CDM systems, including those described above, can be used to perform various methods. FIG. 5 shows a flow diagram of an illustrative method 500 for coupling delay matching, according to various embodiments. Embodiments of the method 500 begin at stage 508 by receiving a signal by a programmable delay component. The received signal oscillates at a VCO period. In some cases, the signal is received from a voltage-controlled oscillator (VCO) via a set of signal path components, and the signal as received by the programmable delay component is delayed with respect to the signal as output by the VCO by a first signal delay introduced by the set of signal path components. In other cases, the signal can be received from the VCO and subsequently delayed by the first signal delay introduced by the set of signal path components. At stage 512, embodiments can delay the signal, subsequent to the receiving at stage 508, by a second signal delay using the programmable delay component. The signal can then be output, at stage 516, subsequent to the delaying, from the programmable delay component to a power amplifier.

In some embodiments, the method 500 begins at stage 504 by determining the second signal delay. As described herein, the second signal delay can be determined in such a manner that the signal as received by the power amplifier is delayed by at least the first signal delay and the second signal delay with respect to the signal as output by the VCO so as to be phase-shifted by an amount corresponding to an integer multiple of the VCO period. In some such embodiments, the programmable delay component is programmed in accordance with the determining (e.g., prior to the receiving), such that the second signal delay is introduced responsive to the detecting at stage 504. Other such embodiments can monitor a phase delay between oscillation of an inductor of the VCO and oscillation of an inductor of the PA (e.g., directly or indirectly) and can dynamically control the second signal delay, responsive to the monitoring, to maintain the phase delay at the amount corresponding to the integer multiple of the VCO period. Other such embodiments can detect the phase delay in any suitable manner. For example, embodiments can detecting a phase delay between the PA signal and the VCO signal by injecting a test signal into the signal path, subsequently receiving the test signal from the signal path, and detecting the phase delay between the injected test signal and the received test signal (i.e., as an analog to directly detecting the phase delay between the PA signal and the VCO signal). In such embodiments, the second signal delay can be set in accordance with the detected phase delay, so that the delaying at stage 512 is responsive to the determining and setting.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A transmitter system comprising:
   a voltage-controlled oscillator (VCO) having a first inductor coupled with a VCO output, such that a VCO signal generated at the VCO output oscillates at a VCO period in accordance with oscillation of the first inductor;
   a power amplifier (PA) having a second inductor coupled with a PA input, such that the second inductor oscillates at a PA period in accordance with oscillation of a PA signal received at the PA input;
   a signal path coupled between the VCO output and the PA input, such that the PA period is substantially the VCO period, the signal path comprising:
   a set of signal path components introducing a first signal delay between the VCO output and the PA input;
   a coupling delay matching (CDM) subsystem to generate a second signal delay between the VCO output and the PA input, the second signal delay determined such that introducing the first signal delay and the second signal delay into the signal path causes the PA signal to be phase-shifted with respect to the VCO signal by an amount corresponding to an integer multiple of half of the VCO period.

2. The transmitter system of claim 1, wherein the CDM subsystem comprises a variable delay component to generate the second signal delay.

3. The transmitter system of claim 2, wherein the variable delay component is a programmable-delay radiofrequency amplifier programmed to generate the second signal delay.

4. The transmitter system of claim 2, wherein the CDM subsystem further comprises:

a lookup table having, stored thereon, a plurality of selectable delay settings; and
a delay controller coupled with the lookup table and the variable delay component, the delay controller to receive a setting instruction, to retrieve one of the selectable delay settings from the lookup table in accordance with the setting instruction, and to configure the variable delay component to generate the second signal delay by applying the retrieved one of the selectable delay settings.

5. The transmitter system of claim 2, wherein the CDM subsystem further comprises:
   a delay detector to detect a phase delay between the PA signal and the VCO signal; and
   a delay controller coupled with the delay detector and the variable delay component, the delay controller to configure the variable delay component to generate the second signal delay in accordance with the detected phase delay.

6. The transmitter system of claim 5, wherein:
   the delay detector dynamically detects the phase delay between the PA signal and the VCO signal; and
   the delay controller dynamically configures the variable delay component to generate the second signal delay responsive to the dynamically detected phase delay.

7. The transmitter system of claim 5, wherein:
   the delay detector detects the phase delay between the PA signal and the VCO signal by injecting a test signal into the signal path, subsequently receiving the test signal from the signal path, and detecting a phase delay between the injected test signal and the received test signal.

8. The transmitter system of claim 1, wherein the set of signal path components is a single component.

9. A method for coupling delay matching, the method comprising:
   receiving a signal by a programmable delay component, the signal oscillating at a VCO period, the signal received from a voltage-controlled oscillator (VCO) via a set of signal path components, such that the signal as received by the programmable delay component is delayed with respect to the signal as output by the VCO by a first signal delay introduced by the set of signal path components;
   delaying the signal, subsequent to the receiving, by a second signal delay using the programmable delay component; and
   outputting the signal, subsequent to the delaying, from the programmable delay component to a power amplifier (PA),
   the second signal delay determined such that the signal as received by the PA is delayed by at least the first signal delay and the second signal delay with respect to the signal as output by the VCO so as to be phase-shifted by an amount corresponding to an integer multiple of half of the VCO period.

10. The method of claim 9, further comprising:
    determining the second signal delay; and
    programming the programmable delay component in accordance with the determining prior to the receiving.

11. The method of claim 9, further comprising:
    monitoring a phase delay between oscillation of an inductor of the VCO and oscillation of an inductor of the PA; and dynamically controlling the second signal delay, responsive to the monitoring, to maintain the phase delay at the amount corresponding to the integer multiple of half of the VCO period.

12. The method of claim 9, further comprising:
detecting a phase delay between the PA signal and the VCO signal by:
   injecting a test signal into the signal path;
   subsequently receiving the test signal from the signal path; and
   detecting the phase delay between the injected test signal and the received test signal; and
setting the second signal delay in accordance with the detected phase delay.

13. A coupling delay matching (CDM) system comprising:
an input node to couple with an output of a voltage-controlled oscillator (VCO) via a set of signal path components, such that a signal as received at the input node is delayed by a first signal delay with respect to the signal as output by the VCO, the first signal delay introduced by the set of signal path components, the signal oscillating at a VCO period;
an output node to couple with an input of a power amplifier (PA); and
a programmable delay component coupled between the input node and the output node, such that the signal as output at the output node is delayed by a second signal delay with respect to the signal as received at the input node, the second signal delay introduced by the programmable delay component,
the second signal delay determined such that introducing the first signal delay and the second signal delay causes the PA signal to be phase-shifted with respect to the VCO signal by an amount corresponding to an integer multiple of half of the VCO period.

14. The CDM system of claim 13, wherein the variable delay component is a programmable-delay radiofrequency amplifier pre-programmed to generate the second signal delay.

15. The CDM system of claim 13, further comprising:
a lookup table having, stored thereon, a plurality of selectable delay settings; and
a delay controller coupled with the lookup table and the variable delay component, the delay controller to receive a setting instruction, to retrieve one of the selectable delay settings from the lookup table in accordance with the setting instruction, and to configure the variable delay component to generate the second signal delay by applying the retrieved one of the selectable delay settings.

16. The CDM system of claim 13, further comprising:
a delay detector to detect a phase delay between the PA signal and the VCO signal; and
a delay controller coupled with the delay detector and the variable delay component, the delay controller to configure the variable delay component to generate the second signal delay in accordance with the detected phase delay.

17. The CDM system of claim 16, wherein:
the delay detector dynamically detects the phase delay between the PA signal and the VCO signal; and
the delay controller dynamically configures the variable delay component to generate the second signal delay responsive to the dynamically detected phase delay.

18. The CDM system of claim 16, wherein:
the delay detector detects the phase delay between the PA signal and the VCO signal by injecting a test signal into the signal path, subsequently receiving the test signal from the signal path, and detecting a phase delay between the injected test signal and the received test signal.

19. The CDM system of claim 13, wherein a delay of the variable delay component is varied by adjusting a control current.

20. The CDM system of claim 13, wherein a delay of the variable delay component is varied by adjusting a capacitance of a load capacitor.

* * * * *